US011862735B2

(12) United States Patent
Zeng et al.

(10) Patent No.: US 11,862,735 B2
(45) Date of Patent: Jan. 2, 2024

(54) BI-DIRECTIONAL BI-POLAR DEVICE FOR ESD PROTECTION

(71) Applicant: GLOBALFOUNDRIES Singapore Pte. Ltd., Singapore (SG)

(72) Inventors: Jie Zeng, Singapore (SG); Raunak Kumar, Singapore (SG); Souvick Mitra, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 182 days.

(21) Appl. No.: 17/383,445

(22) Filed: Jul. 23, 2021

(65) Prior Publication Data
US 2023/0027045 A1 Jan. 26, 2023

(51) Int. Cl.
*H01L 29/861* (2006.01)
*H01L 27/02* (2006.01)
*H01L 29/66* (2006.01)
*H01L 29/735* (2006.01)

(52) U.S. Cl.
CPC ........ *H01L 29/861* (2013.01); *H01L 27/0255* (2013.01); *H01L 27/0259* (2013.01); *H01L 29/66121* (2013.01); *H01L 29/735* (2013.01)

(58) Field of Classification Search
CPC ........... H01L 27/0255; H01L 29/66121; H01L 29/1012; H01L 29/735; H01L 29/6625; H01L 27/0259–0262; H01L 29/41708
See application file for complete search history.

(56) References Cited

U.S. PATENT DOCUMENTS

| 5,602,409 A | 2/1997 | Olney |
| 10,020,386 B1 | 7/2018 | Singh et al. |
| 2014/0376135 A1 | 12/2014 | Huo et al. |
| 2016/0351571 A1* | 12/2016 | Chan ..................... H01L 27/027 |
| 2018/0151437 A1* | 5/2018 | Wen .................... H01L 29/1008 |

(Continued)

OTHER PUBLICATIONS

Vashchenko et al., "Multi-Port ESD Protection Using Bi-Directional SCR Structures", Bipolar/BiCMOS Circuits and Technology Meeting, 2003, pp. 137-140, IEEE.

(Continued)

*Primary Examiner* — Wasiul Haider
(74) *Attorney, Agent, or Firm* — VIERING JENTSCHURA & PARTNER MBB

(57) ABSTRACT

An electrostatic discharge (ESD) protection device including: a substrate including: a first, second and third doped regions, the second doped region disposed between the first and third doped regions, the second doped region has a first conductivity type and a first doping concentration and the first and third doped regions have a second conductivity type and a second doping concentration; first and second doped terminal regions disposed within the first and second doped regions, respectively; and a doped island region disposed within the second doped region, the first and second doped terminal regions and doped island region have the second conductivity type and a third doping concentration, the third doping concentration higher than the first and second doping concentrations; and conductive terminals respectively coupled to the doped terminal regions; and an insulation layer arranged on the substrate between the conductive terminals and covering at least the second doped region.

18 Claims, 13 Drawing Sheets

(56) References Cited

U.S. PATENT DOCUMENTS

2021/0036152 A1* 2/2021 Tsai ................ H01L 29/6656
2021/0082905 A1   3/2021 Zeng et al.
2022/0376119 A1* 11/2022 Yoo ................. H01L 29/0646

OTHER PUBLICATIONS

Tsai et al., "Novel Dual Direction PNP with Self-bias Ring Structure", 2014 IEEE International Reliability Physics Symposium, 2014, 4 pages, IEEE.

* cited by examiner

BI-DIRECTIONAL BI-POLAR DEVICE FOR ESD PROTECTION

TECHNICAL FIELD

The present disclosure relates generally to electrostatic discharge (ESD) protection devices and methods for forming ESD protection devices.

BACKGROUND

Electronic apparatuses can be damaged by ESD voltages higher than the usual voltages supplied to these apparatuses. Accordingly, the electronic apparatuses are often coupled to ESD protection devices to protect them against such damage. When the ESD voltage is below a predefined level, negligible current flows through these ESD protection devices. However, when the ESD voltage exceeds a predefined level, the ESD protection devices may turn on to conduct current away from the apparatuses, hence protecting the apparatuses from damage.

A normal NPN (or PNP) based ESD protection device is a unidirectional device and cannot be directly used for bi-directional ESD protection. That is, a normal bi-polar ESD protection device can only support a single polarity high voltage bias, i.e., sustain a high voltage bias in only one direction. For example, with reference to a typical NPN transistor based ESD protection device, the high voltage bias can only be applied in the direction from the collector terminal to the emitter/base terminal for the NPN transistor (or from the emitter/base terminal to the collector terminal for the PNP transistor) to operate as an effective ESD protection device. Otherwise, if the voltage at the emitter/base terminal is much higher (e.g. more than 0.7V higher) than the voltage at the collector terminal, the NPN transistor is forward biased and may turn on to conduct current away from the apparatus, even when the voltage bias between the terminals is below the predefined level.

SUMMARY

According to various embodiments, there may be provided a semiconductor device providing ESD protection. The ESD protection device may include a substrate including a bi-polar junction transistor arranged in the substrate, including: a first doped region, a second doped region, and a third doped region, the second doped region disposed between the first and third doped regions, wherein the second doped region is of a first conductivity type and a first doping concentration and the first and third doped regions are of a second conductivity type and a second doping concentration; a first doped terminal region disposed within the first doped region; a second doped terminal region disposed within the third doped region; and a doped island region disposed within the second doped region, wherein the first doped terminal region, second doped terminal region and doped island region are of the second conductivity type and a third doping concentration, the third doping concentration being higher than the first doping concentration and the second doping concentration; and a first conductive terminal coupled to the first doped terminal region; a second conductive terminal coupled to the second doped terminal region; and an insulation layer arranged on the substrate between the first and second conductive terminals, the insulation layer covering at least the second doped region.

According to various embodiments, there may be provided a method for forming an ESD protection device. The method may include: providing a substrate including a bi-polar junction transistor arranged in the substrate, including: providing a first doped region, a second doped region, and a third doped region, the second doped region disposed between the first and third doped regions, wherein the second doped region is of a first conductivity type and a first doping concentration and the first and third doped regions are of a second conductivity type and a second doping concentration; providing a first doped terminal region disposed within the first doped region; providing a second doped terminal region disposed within the third doped region; and providing a doped island region disposed within the second doped region, wherein the first doped terminal region, second doped terminal region and doped island region are of the second conductivity type and a third doping concentration, the third doping concentration being higher than the first doping concentration and the second doping concentration; and providing a first conductive terminal coupled to the first doped terminal region; providing a second conductive terminal coupled to the second doped terminal region; and providing an insulating layer arranged on the substrate between the first and second conductive terminals, the insulating layer covering at least the second doped region.

Additional features for advantageous embodiments are provided in the dependent claims.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

Figure 1:
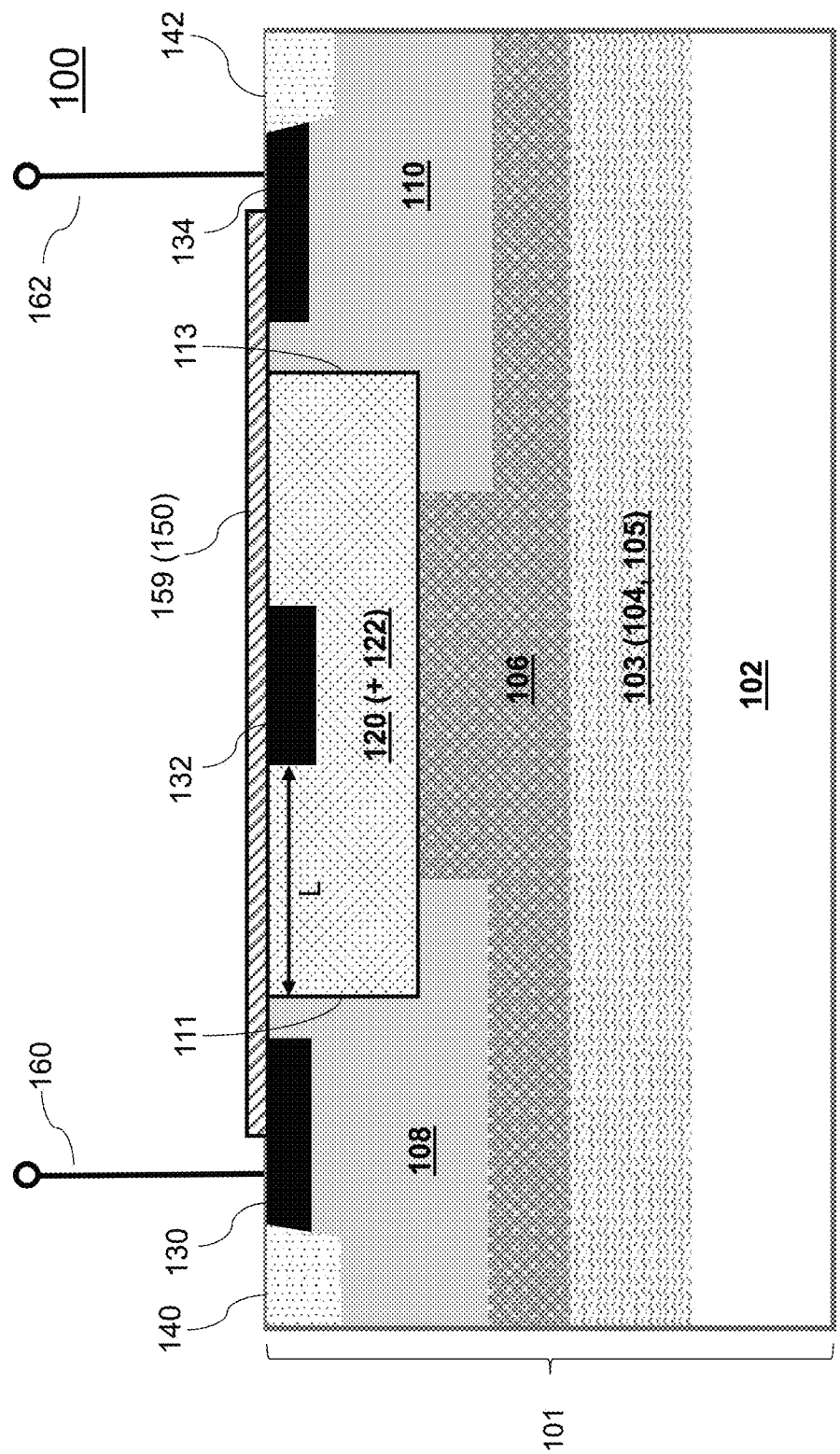
FIG. 1 shows a simplified cross-sectional view of a bi-directional ESD device according to various non-limiting embodiments.

The embodiments of the present disclosure generally relate to semiconductor devices. More particularly, the embodiments relate to providing ESD protection devices in semiconductor devices. Such ESD protection devices may, for example, be incorporated into integrated circuits (ICs). The semiconductor devices or ICs may be used with apparatuses such as, but not limited to, consumer electronic products. Existing methods for integrating ESD protection devices into the semiconductor devices require multiple etching masks and large footprints. Some embodiments relate to ESD protection devices that have a smaller footprint and that may be integrated into semiconductor devices with a reduced number of etching masks in the manufacturing process.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "approximately", "about," is not limited to the precise value specified. In some instances, the approximating language may correspond to the precision of an instrument for measuring the value. Further, a direction is modified by a term or terms, such as "substantially" to mean that the direction is to be applied within normal tolerances of the semiconductor industry. For example, "substantially parallel" means largely extending in the same direction within normal tolerances of the semiconductor industry and "substantially perpendicular" means at an angle of ninety degrees plus or minus a normal tolerance of the semiconductor industry.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while considering that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

FIG. 1 shows a simplified cross-sectional view of a bi-directional bi-polar ESD device according to various non-limiting embodiments.

Figure 2:
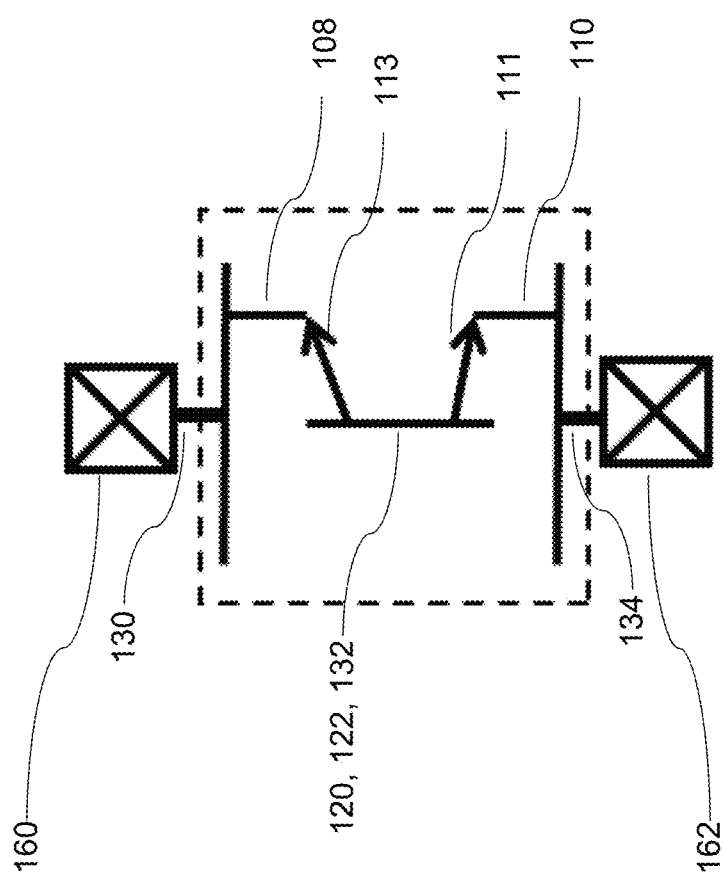
FIG. 2 shows a simplified schematic view of the bi-directional ESD device of FIG. 1 according to various non-limiting embodiments.

FIG. 2 shows a simplified schematic view of a bi-directional bi-polar ESD device of FIG. 1 according to various non-limiting embodiments.

Referring to FIG. 1, an ESD device according to various non-limiting embodiments of the present disclosure may include a symmetrical bi-directional bi-polar transistor structure with two emitter/collector portions. The emitter/collector portions may each include a highly doped terminal region of a second conductivity type 130, 134 (e.g., N+ region or P+ region) within a medium-voltage well region of the second conductivity type 108, 110 (e.g., MV Well or MV PWell). The highly doped terminal regions 130, 134 are connected to conductive terminals 160, 162 (e.g., formed in a metal layer over the substrate). In the center between the emitter/collector portions, there is a highly doped floating region (i.e., not connected to any terminal) of the second conductivity type 132 (e.g., N+ region or P+ region) which is within and surrounded by a low-voltage well region of the first conductivity type 120 (e.g., LV PWell or LV NWell) and a drift region of the first conductivity type 122 (e.g. P-Drift or N-Drift). The highly doped floating center island region 132 is isolated from both the highly doped terminal regions by a blocking or insulating layer 159 formed on the surface of the substrate. The insulating layer 159 may be formed between the conductive terminals and over at least a surface of the low-voltage well region with drift region 120, 122 which within the substrate separates the two emitter/collector portions including the emitter/collector terminals from the floating center island region). The insulating layer 159 may be a silicide blocking layer 150 (e.g., SAB) or polysilicon blocking layer 151a, 151b, but not a shallow trench isolation (STI) structure. The bi-directional bi-polar transistor structure is arranged within a high-voltage well of a first conductivity type 106 (e.g., HV PWell or HV NWell) that is isolated from a bulk substrate region of a first conductivity type 102 (e.g., P-Sub or N-Sub). A substrate isolation region 103 separates the high-voltage well of the first conductivity type 106 (e.g., HV PWell or HV NWell) from the bulk substrate region of the first conductivity type 102 (e.g., P-Sub or N-Sub). The substrate isolation region 103 may be an epitaxial doped region having a second conductivity type (e.g., N-epi or P-epi) or a buried oxide region.

The low-voltage well and drift region of the first conductivity type 120, 122 (e.g., P-type region or N-type region) may also compensate a part of the medium-voltage well of a second conductivity type 108, 110 (e.g., MV NWell or MV PWell) at a top portion (e.g., towards a surface of the substrate 101 opposite the bulk substrate layer 102) to make the top portion of the medium-voltage well into a region of the first conductivity type. That is, the low-voltage well with drift region 120, 122 (e.g., P-type region or N-type region) compensates a part of the medium-voltage well (e.g., MV NWell) at the top as the base of the bi-polar transistor structure (NPN or PNP). In particular, in this region the total doping concentration of the low-voltage well with drift region 120, 122 (e.g., LV PWell and P-Drift or LV NWell and N-Drift) is higher than the doping concentration of the medium-voltage well region 108, 110 (e.g., MV NWell or MV PWell) causing the net doping concentration in a portion of the medium-voltage well region 108, 110 near the terminals 160, 162 to become a first conductivity type (e.g. P-type or N-type).

Referring to FIG. 1, in some non-limiting embodiments, in the plurality of doped regions of a first conductivity type (102, 106, 120, 122) and a second conductivity type (103, 108, 110, 130, 132, 134), the first conductivity type is a P-type and the second conductivity type is an N-type. Alternatively, in other non-limiting embodiments, in the plurality of doped regions of a first conductivity type (102, 106, 120, 122) and a second conductivity type (103, 108, 110, 130, 132, 134), the first conductivity type is an N-type and the second conductivity type is a P-type.

The ESD protection device 100 may include a substrate 101. In various non-limiting embodiments, the substrate 101 may include any silicon-containing substrate including, but not limited to, silicon (Si), single crystal silicon, polycrystalline Si, amorphous Si, silicon-on-sapphire (SOS), silicon-on-insulator (SOI) or silicon-on-replacement insulator (SRI) or silicon germanium substrates and the like. Substrate 102 may in addition include various isolations, dopings and/or device features. The substrate 102 may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, GaInAsP, or combinations thereof.

In various non-limiting embodiments, the substrate 101 may have a bulk or substrate region 102 arranged within substrate 101. The substrate region 102 may have a first conductivity type. For example, the substrate region 102 may have a first conductivity type that is a P type. In such case, the substrate region 102 may contain P type dopants. The doping concentration of the substrate region 102 may range from about $1E15$ $cm^{-3}$ to $5E15$ $cm^{-3}$. Accordingly, the substrate region 102 may include a P type substrate region (e.g., P-Sub). However, in alternative non-limiting embodiments, the substrate 101 may have a substrate region 102 of a first conductivity type that is an N type. Accordingly, the substrate region 102 may include an N type substrate region (e.g., N-Sub). In such case, the substrate region 102 may contain N type dopants with a similar doping concentration as with P type dopants.

The substrate 101 of the ESD protection device 100 may further include a substrate isolation region 103 arranged within substrate 101 and at least partially over the substrate region 102. The substrate isolation region 103 may be an epitaxial region 104. The epitaxial region 104 may have a second conductivity type different from the first conductivity type of substrate region 102. The epitaxial region 104 may have a higher doping concentration than the substrate region 102. For example, the epitaxial region 104 may have a doping concentration ranging from about $5E15$ $cm^{-3}$ to $1E16$ $cm^{-3}$. In some exemplary non-limiting embodiments, the first conductivity type may be P type and the second conductivity type may be N type. In such case, the epitaxial region 104 may include N type dopants. Accordingly, the epitaxial region 104 may include an N-epitaxial region. However, in alternative non-limiting embodiments, the first conductivity type may be N type and the second conductivity type may be P type. In such case, the epitaxial region 104 may include P type dopants. Accordingly, the epitaxial region 104 may include a P-epitaxial region (e.g., P-Epi). Alternatively, the substrate isolation region 103 may include a deep well region instead of an epitaxial region. For example, in some embodiments, a deep Well (or deep PWell) may be used instead of an N-epitaxial region (or P-epitaxial region, respectively).

The substrate 101 of the ESD protection device 100 may further include a first conductivity region 106 arranged within substrate 101 and at least partially over both the substrate isolation region 103 (e.g., epitaxial region 104) and the substrate region 102. The first conductivity region 106 may have a first conductivity type similar to substrate region 102. The first conductivity region 106 may have a higher doping concentration than the doping concentration of the substrate region 102 and the substrate isolation region 103. The first conductivity region 106 may be a high-voltage well region. For example, the first conductivity region 106 may have a doping concentration ranging from about $1E16$ $cm^{-3}$ to $5E16$ $cm^{-3}$. In some exemplary non-limiting embodiments, the first conductivity type may be P type and the second conductivity type may be N type. In such case, the first conductivity region 106 may include P type dopants. Accordingly, the first conductivity region 106 may include a high-voltage P type well (e.g., HV PWell). However, in alternative non-limiting embodiments, the first conductivity type may be N type and the second conductivity type may be P type. In such case, the first conductivity region 106 may include N type dopants. Accordingly, the first conductivity region 106 may include a high-voltage N type well (e.g., HV N-Well).

The substrate 101 of the ESD protection device 100 may further include a first terminal portion including a second conductivity region 108 and a second terminal portion including a third conductivity region 110, the first and second terminal portions are arranged within substrate 101 and at least partially over the first conductivity region 106. The second and third conductivity regions 108, 110 may be arranged to be spaced apart from each other. At least a portion of the second conductivity region 108 and the third conductivity region 110 may each be arranged immediately below a top surface of substrate 101. The top surface of substrate 101 being opposite the substrate region 102. The second conductivity region 108 and the third conductivity region 110 may each be a medium-voltage well. The second and third conductivity regions 108, 110 may have a second conductivity type same as epitaxial region 104 or deep well region of the substrate isolation region 103. In some exemplary non-limiting embodiments, the first conductivity type may be P type and the second conductivity type may be N type. In such case, the second conductivity region 108 and the third conductivity region 110 may include N type dopants. Accordingly, the second and third conductivity regions 108, 110 may each include a medium-voltage N type well region (e.g., MV Well). However, in alternative non-limiting embodiments, the first conductivity type may be N type and the second conductivity type may be P type. In such case, the second and third conductivity regions 108, 110 may include P type dopants. Accordingly, the second and third conductivity regions 108, 110 may each include a medium-voltage P type well region (e.g., MV PWell). The second and third conductivity regions (medium-voltage well regions) may have a higher doping concentration than the first conductivity region 106. For example, the second and third conductivity regions may have a doping concentration ranging from about 1E17 cm$^{-3}$ to 5E17 cm$^{-3}$.

The first and second terminal portions may each further include respective terminal regions. A first terminal region 130 may be arranged at least partially within the second conductivity region 108. The first terminal region 130 may be configured for connection to a first external voltage. A second terminal region 134 may be arranged at least partially within the third conductivity region 110. The second terminal region 134 may be configured for connection to a second external voltage.

The first and second terminal regions 130, 134 may have the second conductivity type same as the conductivity type of the second and third conductivity regions 108, 110. The first terminal region 130 and the second terminal region 134 may each include highly doped regions. That is, the doping concentration of the first and second terminal regions 130, 134 is higher than the doping concentration of the second and third conductivity regions 108, 110. In some exemplary non-limiting embodiments, the first conductivity type may be P type and the second conductivity type may be N type. In such case, the first and second terminal regions 130, 134 may include N type dopants. Accordingly, the first and second terminal regions 130, 134 may each be an N+ region. However, in alternative non-limiting embodiments, the first conductivity type may be N type and the second conductivity type may be P type. In such case, the first and second terminal regions 130, 134 may include P type dopants. Accordingly, the first and second terminal regions 130, 134 may each be a P+ region.

Referring to an exemplary non-limiting embodiment as shown in FIG. 1, the first terminal region 130 and second terminal region 134 may be arranged immediately below a top surface of substrate 101. The first terminal region 130 may be connected to a first external terminal 160 to which the first external voltage may be applied and the second terminal region 134 may be connected to a second external terminal 162 to which the second external voltage may be applied. Further, the first and second terminal regions 130, 134, and the second and third conductivity regions 108, 110 may be isolated from the substrate region 102 via the first conductivity region 106 and the substrate isolation region 103 (e.g., epitaxial region 104).

The substrate 101 of the ESD protection device 100 may further include a fourth conductivity region 120 arranged within the substrate 101 and at least partially over the first conductivity region 106. At least a portion of the fourth conductivity region 120 may be arranged immediately below a top surface of substrate 101. At least a portion of the fourth conductivity region 120 may further abut (i.e., directly contact) a portion of the first conductivity region 106. The fourth conductivity region 120 may further be arranged centrally (e.g., equidistant) between the second conductivity region 108 and the third conductivity region 110 of the first and second terminal portions. The fourth conductivity region 120 may also abut (i.e., directly contact) the second and third conductivity regions 108, 110. A first sidewall 111 of the fourth conductivity region 120 may abut the second conductivity region 108 and a second side wall 113 (opposite the first sidewall) of the fourth conductivity region 120 may abut the third conductivity region 110. The fourth conductivity region 120 is separated from the first and second terminal regions 130, 134 by at least a portion of the second and third conductivity regions. Additionally, in some embodiments, a portion of the fourth conductivity region 120 may further overlap a portion of the second conductivity region 108 and another portion of the fourth conductivity region 120 may further overlap a portion of the third conductivity region 110. The overlap may provide better performance of the ESD protection device.

The fourth conductivity region 120 may be a low-voltage well region having a first conductivity type. In some exemplary non-limiting embodiments, the first conductivity type may be P type and the second conductivity type may be N type. In such case, the fourth conductivity region 120 may include P type dopants. Accordingly, the fourth conductivity region 120 may include a low-voltage P type well (e.g., LV PWell). However, in alternative non-limiting embodiments, the first conductivity type may be N type and the second conductivity type may be P type. In such case, the fourth conductivity region 120 may include N type dopants. Accordingly, the fourth conductivity region 120 may include a low-voltage N type well (e.g., LV NWell).

Referring to an exemplary non-limiting embodiment as shown in FIG. 1, the fourth conductivity region may be arranged immediately below a top surface of substrate 101. Further, the fourth conductivity region 120 may be separated from the substrate region 102 via the first conductivity region 106 and the substrate isolation region 103 (e.g., epitaxial region 104).

The fourth conductivity region 120 may further include a floating (or unconnected) center island region 132. The floating region 132 may be a highly doped region arranged within the fourth conductivity region 120. The floating region 132 may be arranged at a center of the fourth conductivity region 120 so that the floating region 132 is equidistant from the first sidewall 111 and the second sidewall 113 of the fourth conductivity region 120. The floating region 132 may be arranged a distance L away from the first and second sidewalls 111 and 113 of the fourth conductivity region 120. The distance L tunes the bi-directional bi-polar ESD protection device for different voltage application. The breakdown voltage and holding voltage may change based on the distance L. For example, a bi-directional NPN (or PNP) device with a longer distance L between the floating region and the sidewalls has a higher breakdown voltage and higher holding voltage than one with a shorter distance L. A bi-directional NPN (or PNP) device with a shorter distance L between the floating region and the sidewalls has a lower breakdown voltage and lower holding voltage than one with a longer distance L. The floating region 132 has a second conductivity type same as the first and the second terminal regions 130, 134. However, the floating region 132 is not configured for connection to an external voltage. In some exemplary non-limiting embodiments, the first conductivity type may be P type and the second conductivity type may be N type. In such case, the floating region 132 may include N type dopants. Accordingly, the floating region 132 may include a N+ region. However, in alternative non-limiting embodiments, the first conductivity type may be N type and the second conductivity type may be P type. In such case, the floating region 132 may include P type dopants. Accordingly, the floating region 132 may include a P+ region.

Referring to an exemplary non-limiting embodiment as shown in FIG. 1, the floating region 132 may be centrally arranged immediately below a top surface of substrate 101 within the fourth conductivity region 120. Further, the floating region 132 may be isolated from the substrate region 102 via the first conductivity region 106 and the substrate isolation region 103 (e.g., epitaxial region 104).

A depth of the fourth conductivity region 120 may be less than or substantially the same as a depth of the second conductivity region 108 and third conductivity region 110. Referring to an exemplary non-limiting embodiment as shown in FIG. 1, a depth of the fourth conductivity region 120 may less than a depth of the second conductivity region 108 and third conductivity region 110. However, the depths of the second conductivity region 108, the third conductivity region 110 and the fourth conductivity region 120 may be substantially the same in alternative non-limiting embodiments.

The second conductivity region 108 and the third conductivity region 110 may have approximately equal doping concentrations. Further, the doping concentrations of the second and third conductivity regions 108, 110 may be higher than the doping concentration of the first conductivity region 106. The first terminal region 130 and the second terminal region 134 may have higher doping concentrations than the second and third conductivity regions 108, 110, respectively. For example, the second conductivity region 108 may have a doping concentration ranging from about 1E17 cm$^{-3}$ to 5E17 cm$^{-3}$; the third conductivity region 110 may also have a doping concentration ranging from about 1E17 cm$^{-3}$ to 5E17 cm$^{-3}$; the first terminal region 130 may have a doping concentration ranging from about 5E19 cm$^{-3}$ to 5E20 cm$^{-3}$, and the second terminal region 134 may have a doping concentration ranging from about 5E19 cm$^{-3}$ to 5E20 cm$^{-3}$. The second and third conductivity regions 108, 110 and the first and second terminal regions 130, 134 may have a same conductivity type as the epitaxial region 104. That is, they may have the second conductivity type. In exemplary non-limiting embodiments where the first conductivity type may be P type and the second conductivity type may be N type, the second and third conductivity regions 108, 110 may be N type wells and the first and second terminal regions 130, 134 may be N+ regions.

The fourth conductivity region 120 may have a doping concentration ranging from about 5E17 cm$^{-3}$ to 1E18 cm$^{-3}$. Further, the doping concentration of the fourth conductivity region 120 may be higher than the doping concentration of the epitaxial region 104. The fourth conductivity region 120 may have a higher doping concentration than the first conductivity region 106. The fourth conductivity region 120 may have a higher doping concentration than the second and third conductivity regions 108, 110. Providing a fourth conductivity region 120 having a higher doping concentration than the second and third conductivity regions 108, 110 may help to achieve a holding voltage high enough to provide latch-up immunity.

The highly doped floating region 132 may have the same doping concentration as the highly doped first terminal region 130 and the second terminal region 134.

In the plurality of doped regions, the substrate region 102 has the lowest doping concentration. When the substrate isolation region 104 is an epitaxial region 103 or a deep well region it has a higher doping concentration than the substrate region 102. The first conductivity region 106 has a higher doping concentration than the substrate isolation region 104 and/or substrate region 102. The second and third conductivity regions 108, 110 have the same doping concentration and is higher than the doping concentration of the first conductivity region 106. The fourth conductivity region 120 has a higher doping concentration than the second and third conductivity regions 108, 110. The first terminal region 130, floating region 132, and second terminal region 134 have the same doping concentration and is also the highest doping concentration relative to the other regions.

In some exemplary non-limiting embodiments, the fourth conductivity region 120 may further include a drift region 122 (e.g., P-drift for an LV PWell or an N-drift for an LV NWell) along the boundaries (e.g., along sidewalls 111 and 113 of the fourth conductivity region 120) with the second and third conductivity regions 108, 110. The drift region 122 may have a doping concentration ranging from about 5E16 cm$^{-3}$ to 1E17 cm$^{-3}$. The drift regions may help to increase the breakdown voltage of the ESD protection device 100.

The ESD protection device 100 may also include a blocking or an insulating layer 159 arranged over a top surface of the substrate 101. As shown in FIG. 1, the insulating layer 159 may be a silicide blocking layer 150 arranged to extend between the second conductivity region 108 and the third conductivity region 110, overlapping at least a part of these conductivity regions 108, 110 and the fourth conductivity region 120. In various non-limiting embodiments, the silicide blocking layer 150 may prevent silicide interaction or processing on (or in other words, block silicide, that may be deposited during fabrication of the ESD protection device 100, from interacting with) the first terminal region 130, the second terminal region 134, and the floating region 132. The insulating layer 159 is used to electrically insulate the floating region 132 from the terminal regions 130, 134. The silicide blocking layer 150 may be formed of any silicide blocking material known to those skilled in the art, such as, but not limited to, nitride. An insulation layer 159 is needed because silicide material may be generated in any exposed or uncovered regions of the surface of the substrate 101. Electrically, the silicide material acts like a metal and would make the floating region 132 and the terminal regions 130, 134 short together. The silicide blocking material (e.g. nitride) prevents silicide generation in a covered region thus preventing shorts.

The ESD protection device 100 may further include a first isolation element 140 and a second isolation element 142. The first isolation element 140 may be configured to isolate the second conductivity region 108 and first terminal region 130. The second isolation element 142 may be configured to isolate the third conductivity region 110 and the second terminal region 134. The first isolation element 140 is arranged immediately below a top surface of substrate 101 on a side of the first terminal region 130 and second conductivity region 108 facing away from the floating terminal region 132 and the fourth conductivity region 120. The second isolation element 142 is arranged immediately below a top surface of substrate 101 on a side of the second terminal region 134 and third conductivity region 110 facing away from the floating terminal region 132 and the fourth conductivity region 120. That is, the first and second isolation elements 140, 142 are arranged at the ends of the ESD protection device 100. For example, the first and second isolation elements 140, 142 may be shallow trench isolation (STI) blocks.

When the ESD protection device 100 is in use, the ESD protection device 100 may be further configured to connect to an apparatus (not shown in FIG. 1), such as, but not limited to a consumer electronic product, that is to be protected by the ESD protection device 100. In use, the apparatus to be protected is connected to the first and second terminals 160, 162 of the ESD protection device 100. The voltage between these terminals 160, 162 may be referred to as the ESD voltage. The first and second terminals 160, 162 may be an emitter or collector depending on the ESD voltage. That is, one of the first and second terminals 160, 162 may be an emitter and the other one of the first and second terminals 160, 162 may be a collector depending on the direction of the voltage difference of the ESD voltage. When the ESD voltage is below a predefined level, negligible current flows through the ESD protection device 100. However, when the ESD voltage exceeds the predefined level, the ESD protection device 100 turns on to conduct current away from the apparatus, hence protecting the apparatus from damage.

In particular, to protect the apparatus from damage due to overly high ESD voltages between the terminals 160, 162, the ESD protection device 100 may be configured such that when a difference between the first external voltage and the second external voltage exceeds a predetermined threshold, at least one discharge current may pass through the ESD protection device 100.

Referring to FIGS. 1 and 2, the apparatus may be configured to connect to the first terminal region 130 and the second terminal region 134, for example, via the terminals 160, 162. When the first external voltage is higher than the second external voltage, the p-n (or n-p) junction at the first sidewall 111 between the fourth conductivity region 220 and the second conductivity region 108 may be reverse biased. Accordingly, when a difference between the first external voltage and the second external voltage exceeds a first predetermined threshold, the p-n junction at the first sidewall 111 may break down, and a first npn (or pnp) transistor may turn on, which may include the second conductivity region 108 as the collector, the fourth conductivity region 120 as the base and the third conductivity region 110 as the emitter. A first discharge current may then pass from the emitter through the base to the collector of the first npn transistor. In other words, the first discharge current may pass through the fourth conductivity region 120 between the second conductivity region 108 and the third conductivity region 110. The first discharge current may then turn on a second npn (or pnp) transistor which may include the third conductivity region 110 as the emitter, the first conductivity region 106 as the base, and the epitaxial region 104 as the collector. A second discharge current may then pass from the emitter through the base to the collector of this second npn (or pnp) transistor. In other words, the first discharge current may cause the second discharge current to pass through the first conductivity region 106 between the epitaxial region 104 and the third conductivity region 110.

When the second external voltage is higher than the first external voltage, the p-n junction at the second sidewall 113 between the fourth conductivity region 120 and the third conductivity region 110, may also be reverse biased. Accordingly, when a difference between the first external voltage and the second external voltage exceeds the first predetermined threshold, the p-n (or n-p) junction at the second sidewall 113 may break down and a first npn (or pnp) transistor may turn on, which may include the third conductivity region 110 as the collector, the fourth conductivity region 120 as the base and the second conductivity region 108 as the emitter. A first discharge current may then pass from the emitter through the base to the collector of the first npn (or pnp) transistor. In other words, the first discharge current may pass through the fourth conductivity region 120 between the second conductivity region 108 and the third conductivity region 110. The first discharge current may then turn on a second npn (or pnp) transistor which may include the second conductivity region 108 as the emitter, the first conductivity region 106 as the base and the epitaxial region 104 as the collector. A second discharge current may then pass from the emitter through the base to the collector of this second npn transistor. In other words, the first discharge current may cause the second discharge current to pass through the first conductivity region 106 between the epitaxial region 104 and the second conductivity region 108.

Accordingly, as shown in FIG. 2, in various non-limiting embodiments, an equivalent circuit of the ESD protection device 100 may include a transistor having the second conductivity region 108 as the emitter (when the second external voltage is higher than the first external voltage) and the third conductivity region 110 as the emitter (when the first external voltage is higher than the second external voltage). The first conductivity region 106 may act as the base regardless of the direction of the current flow through the ESD protection device. It is understood that the direction of the currents described above may be reversed if the conductivity types in the depicted embodiment of FIG. 2 are reversed.

Providing the substrate isolation region 103 (e.g., epitaxial region 104) and the first conductivity region 106 and setting these regions 103, 106 to float may allow the substrate isolation region 103 to act as a collector of the second npn (or pnp) transistor and the first conductivity region 106 to act as a base of the first and second npn (or pnp) transistors, regardless of the polarity of the voltage between the first and second terminal portions 108/130, 110/134 (in other words, regardless which of the first and second external voltages is higher). Therefore, the ESD protection device 100 may be capable of supporting bi-directional high voltage bias and providing bi-directional ESD current conduction. In various non-limiting embodiments where the first external voltage may be higher than the second external voltage, the first external voltage may be a general power supply voltage (e.g., VDD) and the second external voltage may be ground (e.g., GND), or the first external voltage may be positive and the second external voltage may be negative. In alternative non-limiting embodiments where the first external voltage may be lower than the second external voltage, the second external voltage may be a general power supply voltage (e.g., VDD), and the first external voltage may be ground. Or the first external voltage may be negative, and the second external voltage may be positive.

Further, both the first discharge currents and the second discharge currents through the ESD protection device 100 as described above may help to conduct current away from the apparatus in various non-limiting embodiments. This may allow the ESD protection device 100 to have improved ESD current conduction capability.

Figure 3:
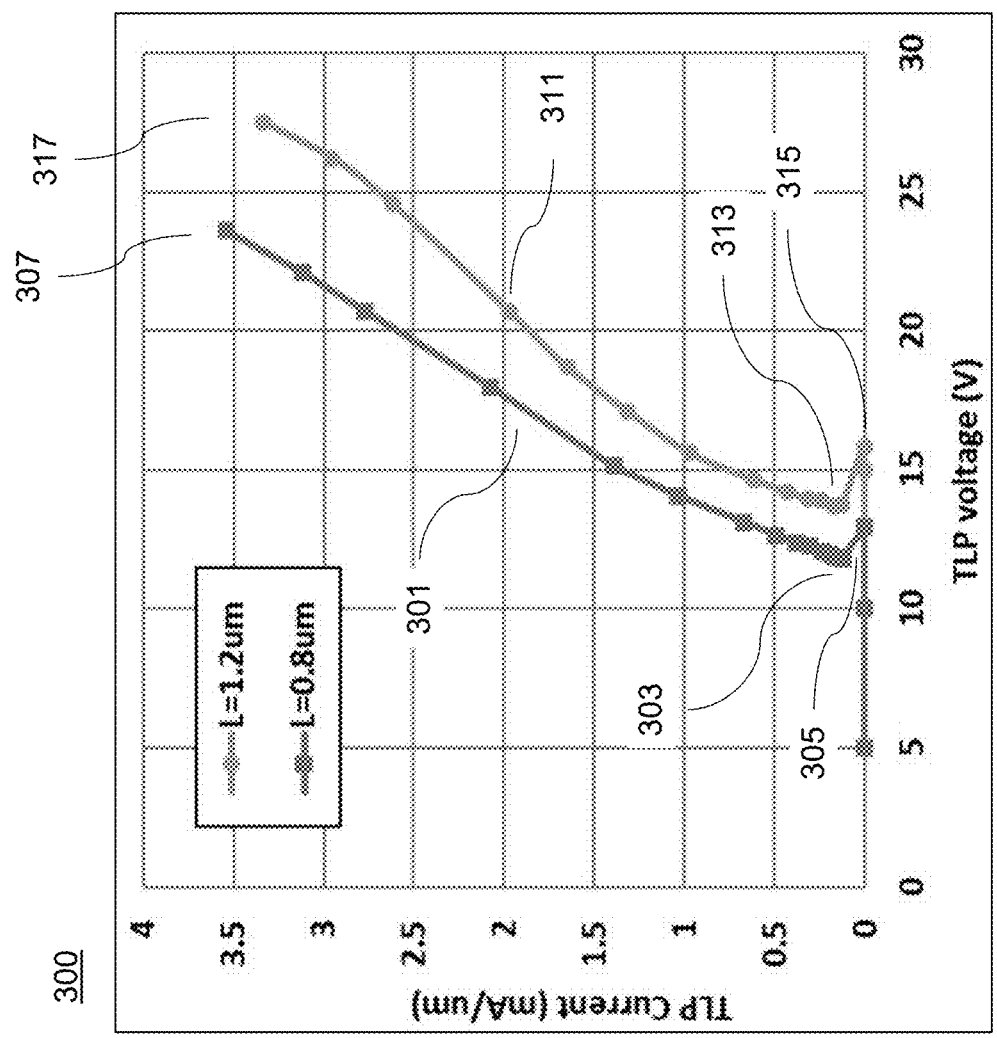
FIG. 3 shows a graph of the performance of the ESD protection device of FIG. 1 for different base lengths obtained from simulating the device using technology computer aided design (TCAD).

In various non-limiting embodiments, the ESD protection device 100 may be compact, and may have good clamping ability (i.e., minimize the change to the on-resistance) and a high holding voltage to provide latch-up immunity. FIG. 3 illustrates TCAD simulated TLP-like I-V curves of the invented Bi-NPN structures with different base lengths. FIG. 3 illustrates the performance of the ESD protection device 100 when a base length of the ESD protection device 100 is set as 0.8 um (301) and 1.2 um (311) and when the first external voltage is greater than the second external voltage. However, due to the symmetry of the structure of the ESD protection device 100, the results obtained when the second external voltage is greater than the first external voltage may be substantially the same as those shown in FIG. 3. In particular, graph 300 are plots of transmission line pulse (TLP) current against transmission line pulse (TLP) voltage. Graph 300 shows results obtained from simulating the device 100 with technology computer aided design (TCAD). Referring to graph 300, the results indicate that the device 100 with a base length of 0.8 um may have a holding voltage (Vh) of about 12.0V (at 303), a triggering voltage (Vt1) of about 13.0V (at 305), a second breakdown voltage (Vt2) of about 23.5V (at 307), and a second breakdown current (It2) of about 3.5 mA/um (at 307). Additionally, the results indicate that the device 100 with a base length of 1.2 um may have a holding voltage (Vh) of about 14.0V (at 313), a triggering voltage (Vt1) of about 16.0V (at 315), a second breakdown voltage (Vt2) of about 27.5V (at 317), and a second breakdown current (It2) of about 3.4 mA/um (at 317). As shown in FIG. 3, each of plots 301 and 311 show a high holding voltage and a small snapback to provide a latch-up immune ESD protection. For example, a holding voltage must be larger than the power supply voltage (e.g., VDD) to avoid latch-up and should be high to minimize the difference between the trigger voltage and the holding voltage (i.e., a small snapback). The plots do not exhibit a bending behavior common in uni-directional NPN devices. There is no bending behavior due to more uniform current flow. The bending behavior is undesirable because that would mean a large increase of turn-on resistance.

Figure 4A:
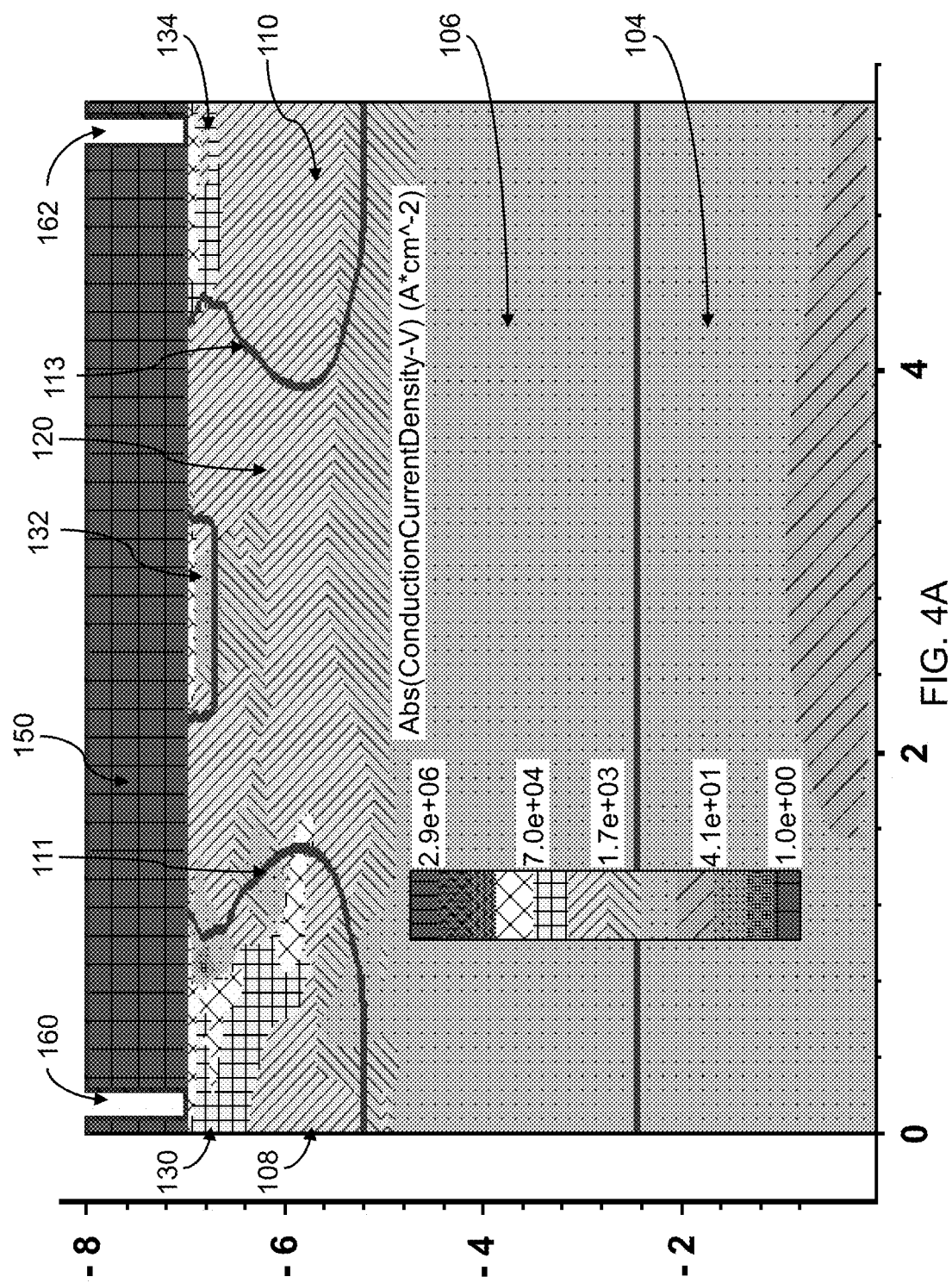
FIGS. 4A and 4B show current density graphs of a portion of the ESD protection device of FIG. 1 for different currents obtained from simulating the device using TCAD.
Figure 4B:
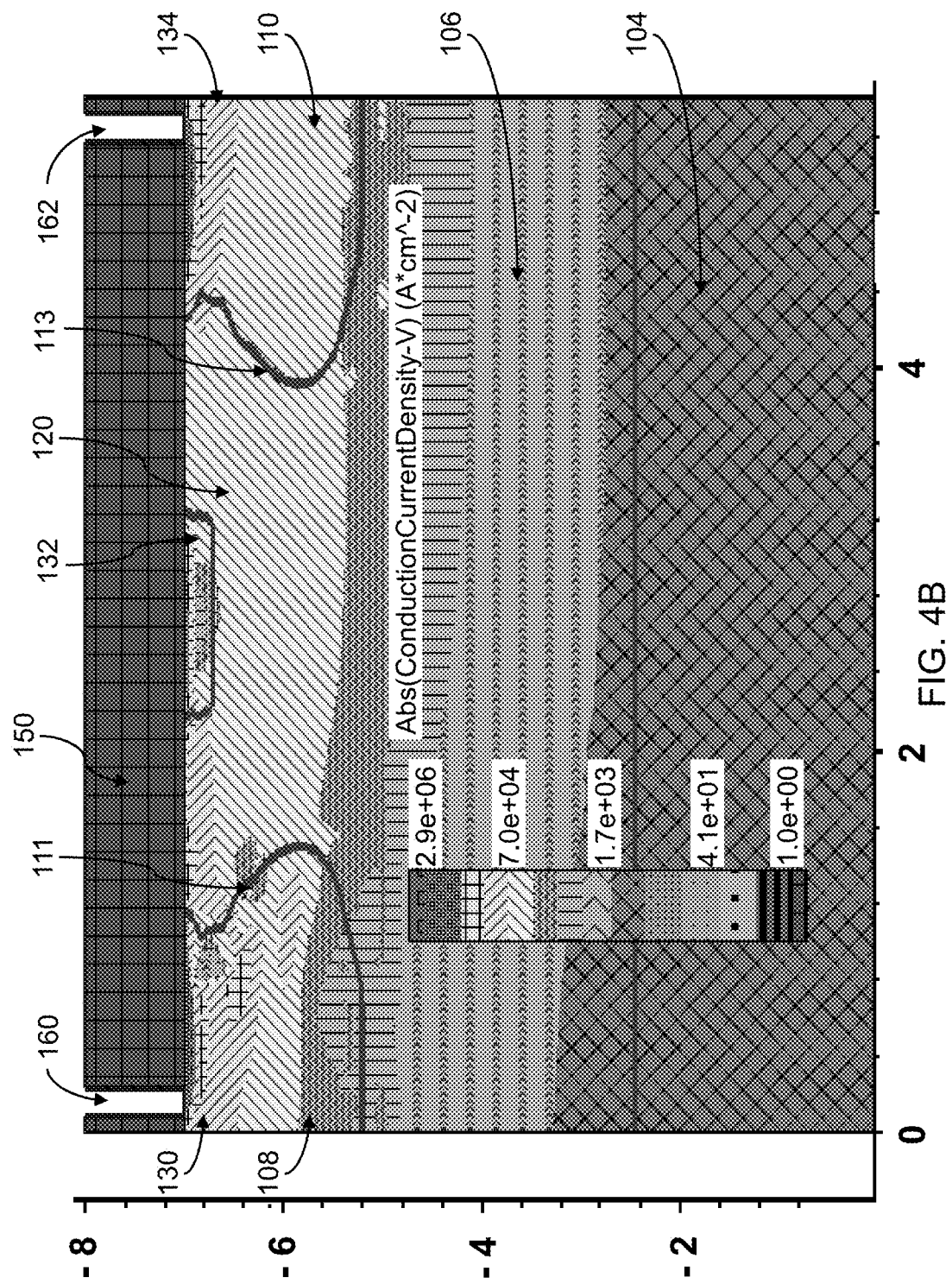

FIGS. 4A-4B show current density graphs of a portion of the ESD protection device 100 obtained from simulating the ESD protection device 100 using TCAD. FIG. 4A illustrates a current density graph for a discharge current of about 0.2 mA/um. FIG. 4B illustrates a current density graph for a discharge current of about 2 mA/um. In the simulation, the first voltage (left terminal) is higher than the second voltage (right terminal). As shown in FIG. 4A, at a lower discharge current, a higher current density flows from the second conductivity region 108 through the first conductivity region 106 as compared to through the fourth conductivity region 120 to the third conductivity region 110. As shown in FIG. 4B, at a higher discharge current, a higher current density flows from the second conductivity region 108 through the fourth conductivity region 120 to the third conductivity region 110 as compared to through the first conductivity region 208. In other words, the current density graph indicates that the first discharge current may be higher than the second discharge current for high discharge currents. This shows that the ESD device 100 is initially triggered at the bottom. But as the discharge current increases, the floating region 132 assists collecting a lot of current at higher current levels.

In various non-limiting embodiments, the implant material for the substrate region 102, epitaxial region 104, first to fourth conductivity regions 106, 108, 110, 120; the terminal regions 130, 134; and the floating region 132 may be the same implant material, for example, an epitaxial silicon material in a non-limiting embodiment. The P type material may be or include, but is not limited to, epitaxial silicon germanium, and/or the N type material may be or include, but is not limited to, doped silicon material including N type dopants. P type dopants can for example, include but are not limited to, boron (B), aluminium (Al), indium (In), or a combination thereof, while N type dopants can include carbon (C), phosphorus (P), arsenic (As), antimony (Sb), or a combination thereof. Other types of implant materials and dopants as known to those skilled in the art may also be useful for forming the regions 102, 104, 106, 108, 110, 120; the terminal regions 130, 134; and the floating region 132.

Figure 5:
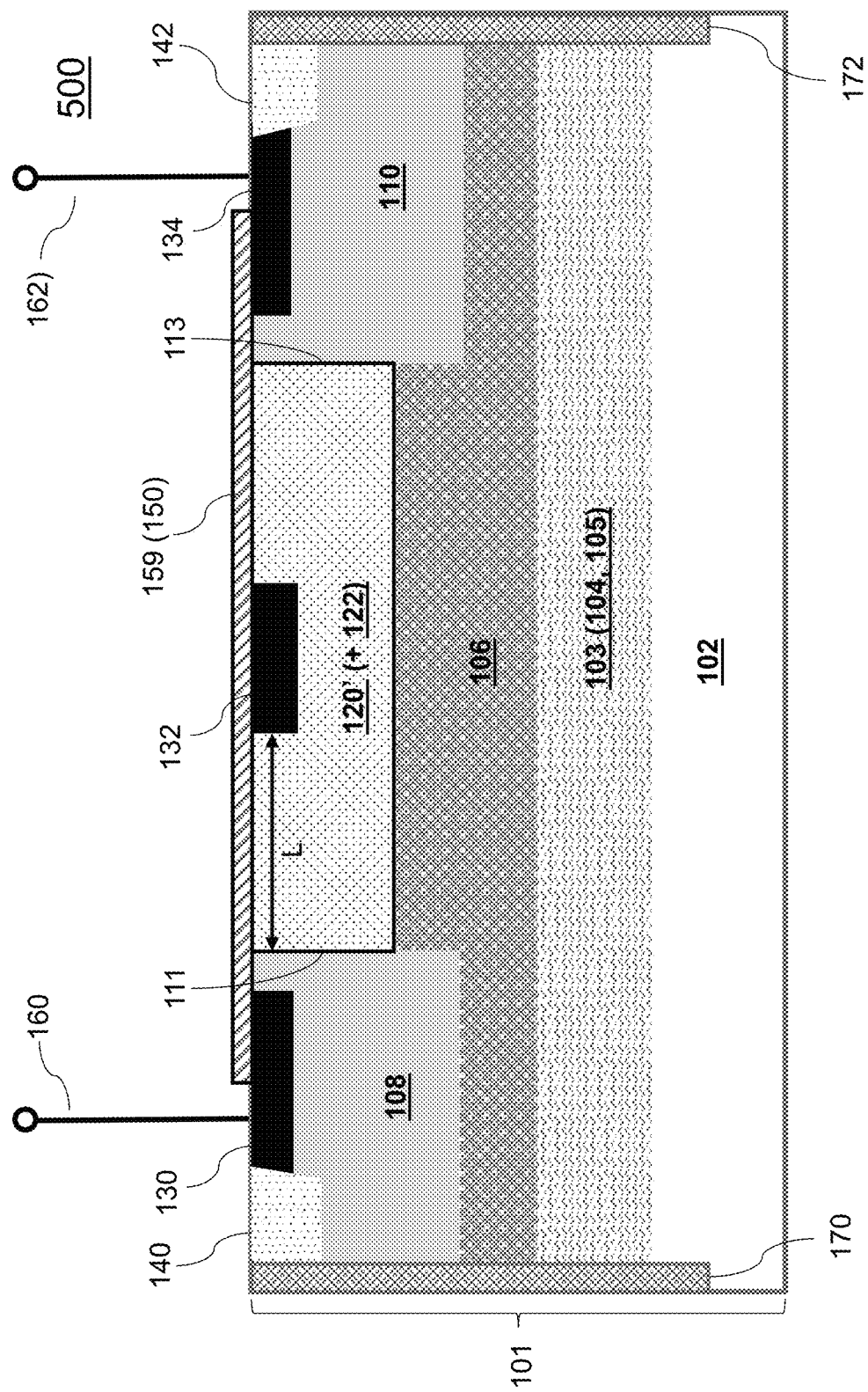
FIG. 5 shows a simplified cross-sectional view of an ESD protection device according to alternative non-limiting embodiments.

FIG. 5 shows a simplified cross-sectional view of an ESD protection device 500 according to alternative non-limiting embodiments. The ESD protection device 500 is similar to the ESD protection device 100 and hence, the common features are labeled with the same reference numerals and need not be discussed. As shown in FIG. 5, the fourth conductivity region 120' is similar to the fourth conductivity region 120 of the ESD protection device 100, except that the fourth conductivity region 120' of the ESD protection device 500 does not overlap the second and third conductivity regions 108, 110. Additionally, the substrate portions of ESD protection device 500 may be further isolated from other devices in the substrate by vertical isolation elements (e.g., trenches) 170, 172. The vertical isolation elements 170, 172 may be deep trench isolation (e.g., DTI) structures that extend from the top surface of the substrate 101 to within the substrate region 102 of the substrate 101 (i.e., bulk substrate). For example, the vertical isolation elements 170, 172 may be arranged at the ends of the ESD protection device 500 adjacent to the first and second isolation elements 140, 142, respectively.

Figure 6:
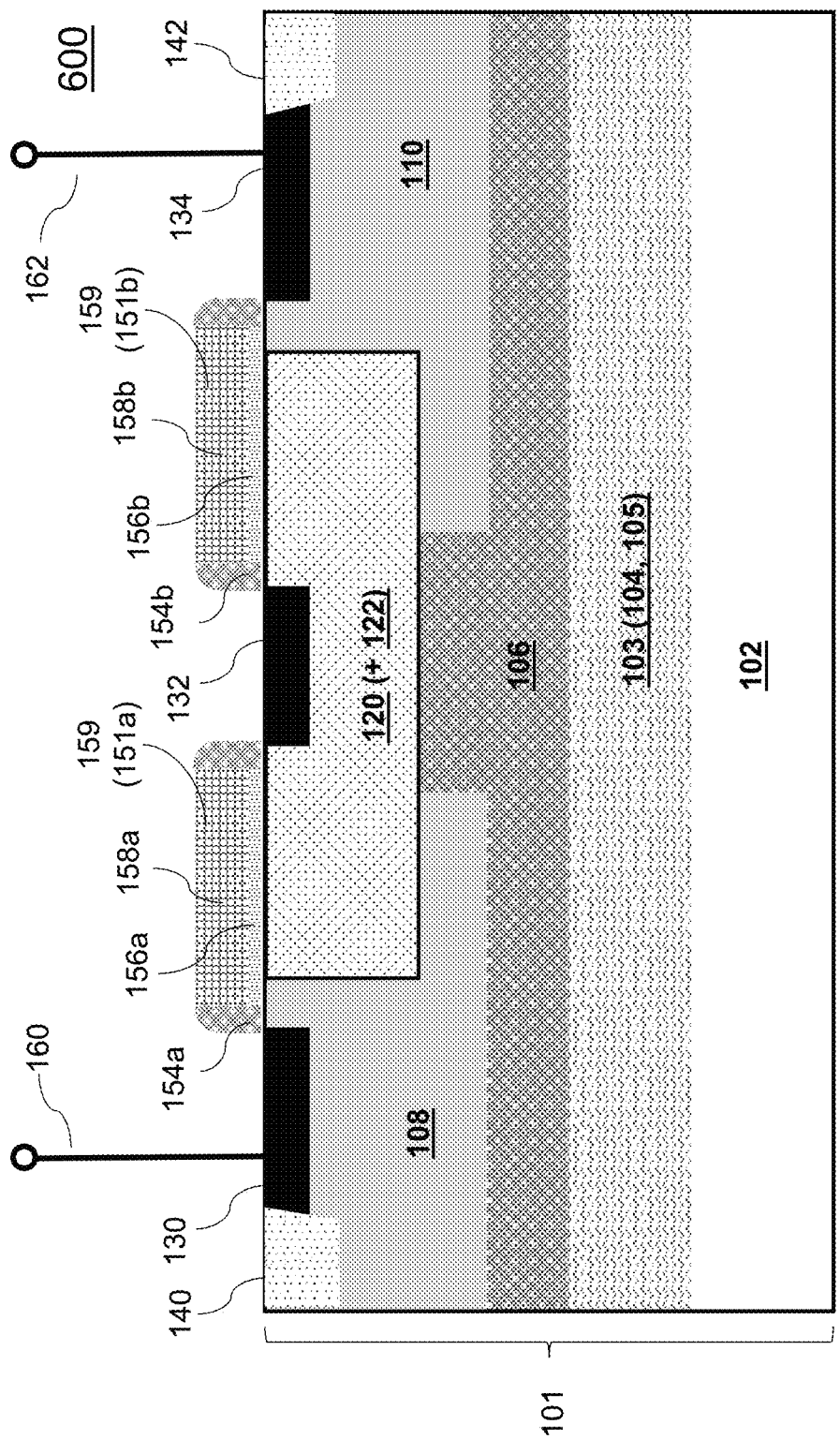
FIG. 6 shows a simplified cross-sectional view of an ESD protection device according to further alternative non-limiting embodiments.

FIG. 6 shows a simplified cross-sectional view of an ESD protection device 600 according to alternative non-limiting embodiments. The ESD protection device 600 is a bi-directional bi-polar ESD protection device with poly bounded junctions. The ESD protection device 600 is similar to the ESD protection device 100 and hence, the common features are labeled with the same reference numerals and need not be discussed. As shown in FIG. 6, the blocking or insulation layer 159 of the ESD protection device 600 may include two poly bounded junctions (e.g., polyblocks) 151a, 151b instead of a silicide blocking layer 150. A polyblock 151a, 151b may include a gate oxide region 156a, 156b, polysilicon 158a, 158b, and spacers 154a, 154b for the polysilicon. A first poly block 151a may insulate the floating region 132 from the first terminal region 130. A second poly block 151b may insulate the floating region 132 from the second terminal region 134.

Figure 7:
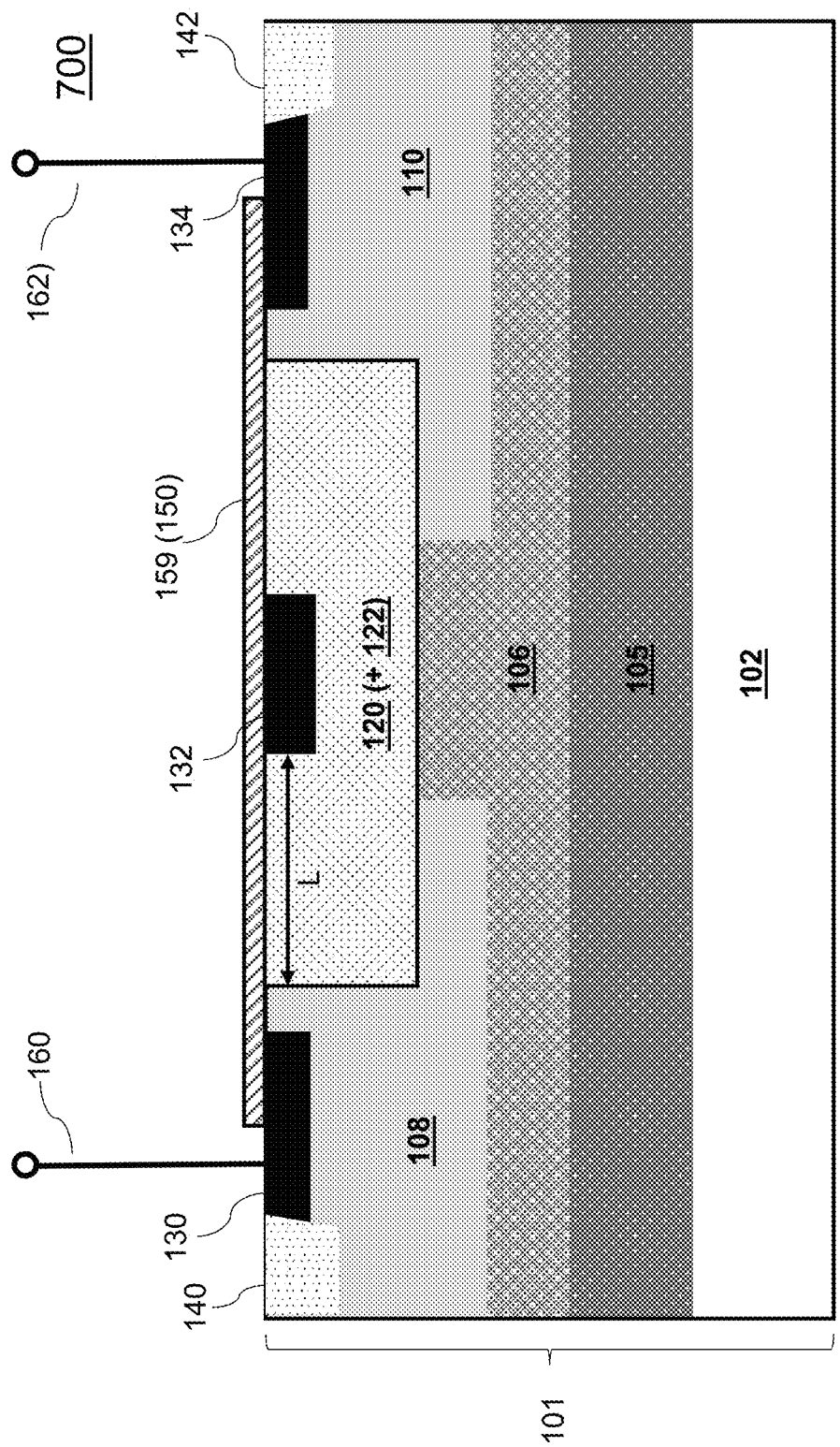
FIG. 7 shows a simplified cross-sectional view of an ESD protection device according to further alternative non-limiting embodiments.

FIG. 7 shows a simplified cross-sectional view of an ESD protection device 700 according to alternative non-limiting embodiments. The ESD protection device 700 is a bi-directional bi-polar ESD protection device formed using a Silicon-on-Insulator (SOI) structure. The ESD protection device 700 is similar to the ESD protection device 100 and hence, the common features are labeled with the same reference numerals and need not be discussed. As shown in FIG. 7, the substrate isolation region 103 may include a buried oxide region 105 rather than an epitaxial region 103. The buried oxide region 105 may be provided between the substrate region 102 and the first conductivity region 106, instead of an epitaxial region or deep well region of the ESD protection device 100. A buried oxide region 105 may facilitate a thinner substrate. An oxide material is a kind of insulator material that hardly conducts current electrically. The oxide material may be used to fully isolate the bi-directional bi-polar device from the substrate. The buried oxide layer 105 may provide much better isolation performance.

Figure 8:
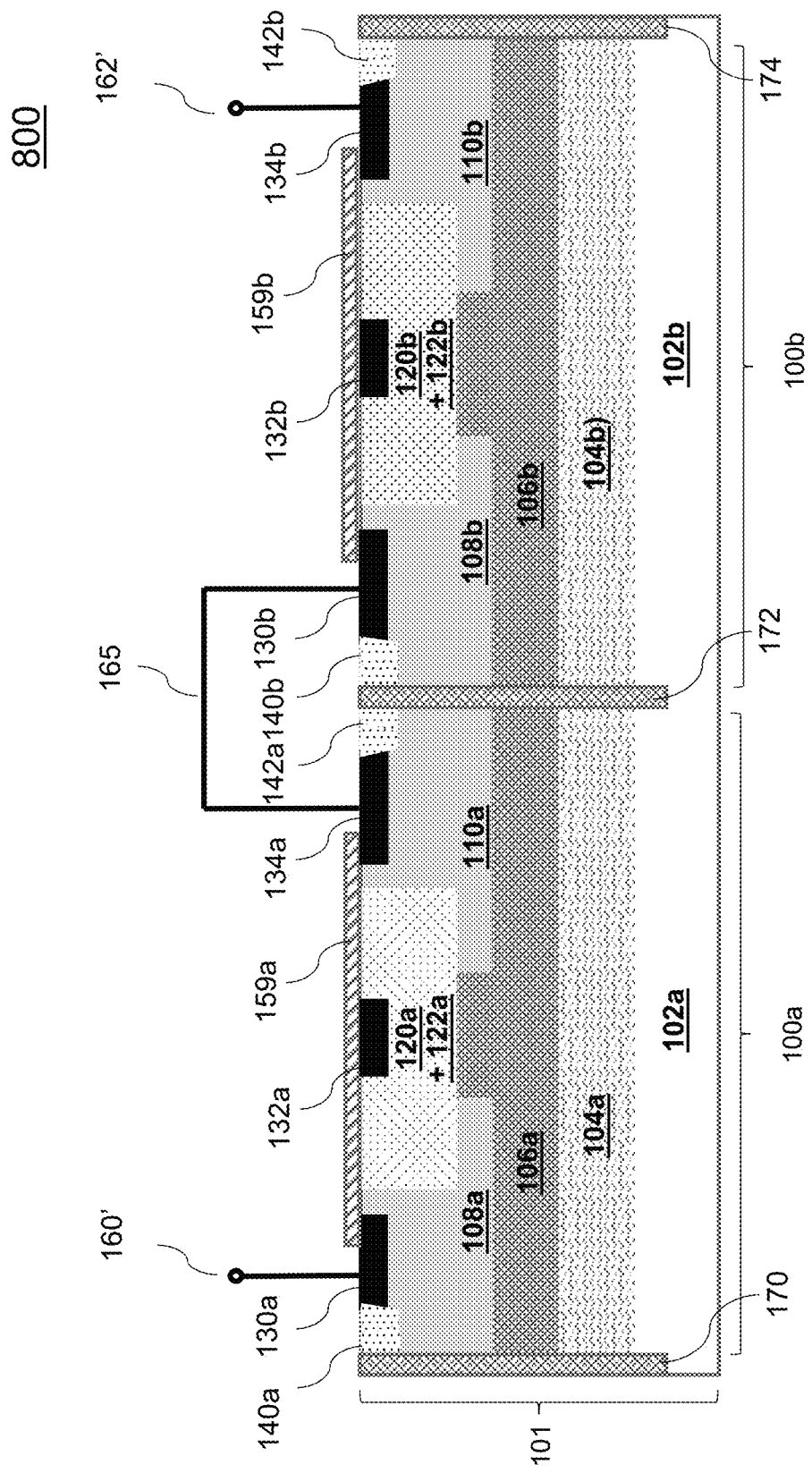
FIG. 8 shows a simplified cross-sectional view of an ESD protection device according to further alternative non-limiting embodiments.

FIG. 8 shows a simplified cross-sectional view of an ESD protection device 800 according to alternative non-limiting embodiments. FIG. 8 illustrates ESD protection devices arranged in a stack for higher voltage applications. The ESD protection device 800 may include stacking two or more of the ESD protection devices 100 to facilitate greater current conduction. For example, as shown in FIG. 8, ESD protection device 800 may include a first ESD protection device 100a and a second ESD protection device 100b arranged adjacent to each other in the substrate 101. The first and second ESD protection devices 100a, 100b may each be an ESD protection device of FIG. 1. The common features are labeled with the same reference numerals and need not be discussed. Referring to FIG. 8, the substrate portions of the first and second ESD protection devices 100a, 100b may be isolated from each other by vertical isolation elements (e.g. trenches) 170, 172, 174. Vertical isolation elements 170, 172, 174 may be deep trench isolation (e.g., DTI) structures that extend from the top surface of the substrate 101 to within the substrate region 102 of the substrate 101 (i.e., bulk substrate). The vertical isolation elements may be arranged between each of the two or more adjacent ESD protection devices (e.g., between the first and second ESD protection devices 100a, 100b) and at the ends of the ESD protection devices configured as the terminal ends (e.g., at the ends of the first and second ESD protection devices 100a, 100b).

Referring to FIG. 8, a first terminal region 130a of the first ESD protection device 100a may be configured for connection to a first external voltage via a first external terminal 160' and a second terminal region 134b of the second ESD protection device 100b may be configured for connection to a second external voltage via a second external terminal 162'. The second terminal region 134a of the first ESD protection device 100a may be connected to a first terminal region 130b of the second ESD protection device 100b via terminal connector 165. The terminal connector 165 may be formed in the same layer as the external terminals 160' and 162' (e.g., metal layer over the substrate).

For even higher voltage ESD protection, additional ESD protection devices 100 may be arranged adjacent to each other in the substrate and their terminals connected in series. For example, a first terminal region of the first ESD protection device may be configured for connection to a first external voltage via a first external terminal and a second terminal region of the last ESD protection device may be configured for connection to a second external voltage via a second external terminal. Each intervening ESD protection device may be daisy chained. For example, the first terminal region of an intervening ESD protection device may be connected to a second terminal region of a preceding ESD protection device and a second terminal region of an intervening ESD protection device may be connected to a first terminal region of a subsequent ESD protection device.

Alternatively, the ESD protection devices 100a, 100b may also be one of the ESD protection devices 500, 600, or 700.

Figure 9A:
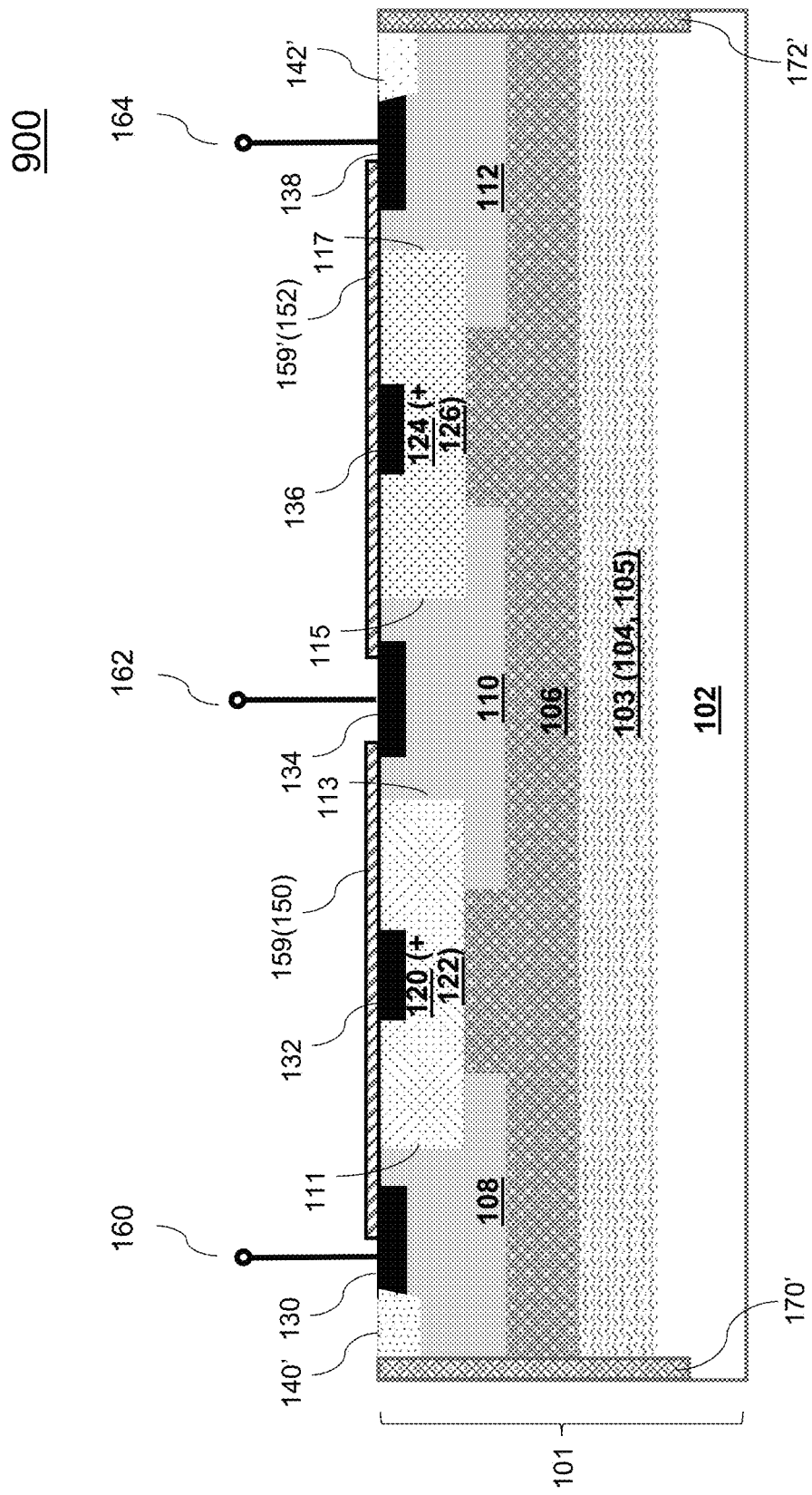
FIG. 9A shows a simplified cross-sectional view of an ESD protection device according to further alternative non-limiting embodiments.
Figure 9B:
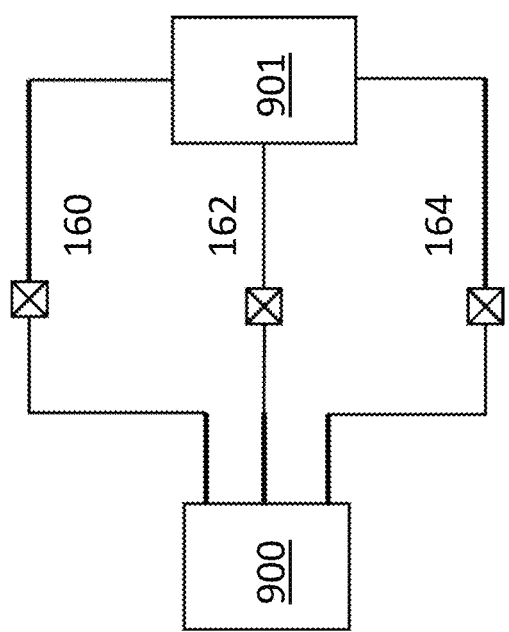
FIG. 9B shows a simplified schematic view of the ESD protection device of FIG. 9A.

FIG. 9A shows a simplified cross-sectional view of an ESD protection device 900 according to alternative non-limiting embodiments. FIG. 9A illustrates an ESD protection device configured for multiple terminal protection. In particular, FIG. 9A illustrates an ESD protection device 900 for a three terminal structure where each terminal (160, 162, 164) is isolated from the other two terminals. For example, the three terminals may be a supply terminal (e.g., VDD), an input/output terminal (e.g., TO), and a ground terminal (e.g., GND). The ESD protection device 900 can provide dual polarity ESD current conduction for both a VDD to I/O path and an I/O to ground path within one structure. Portions of the ESD protection device 900 are similar to the ESD protection device 100 and hence, the common features are labeled with the same reference numerals and need not be discussed. FIG. 9B shows a simplified schematic view of the ESD protection device 900 according to various aspects of the present disclosure. As shown in FIG. 9B, the ESD protection device 900 may be connected to and/or integrated with another semiconductor device 901 (e.g., a consumer electronic apparatus) to provide ESD protection to the semiconductor device 901.

As shown in FIG. 9A, the ESD protection device 900 may further include a third terminal portion. The third terminal portion may include a fifth conductivity region 112, a third terminal region 138, and a third external terminal 164. The fifth conductivity region 112 may be arranged within substrate 101 and at least partially over the first conductivity region 106. The fifth conductivity region 112 is similar to the second and third conductivity regions 108, 110. That is, the doping concentration is similar to and the conductivity type is the same as the second and third conductivity regions 108, 110. Further, the second, third, and fifth conductivity regions 108, 110, 112 may be arranged to be spaced apart from each other within the first conductivity region 106. At least a portion of the fifth conductivity region 112 may also be arranged immediately below a top surface of substrate 101. The fifth conductivity region 112 may also be a medium-voltage well. The fifth conductivity region 112 may also have a second conductivity type same as the second and third conductivity regions 108, 110. In some exemplary non-limiting embodiments, the first conductivity type may be P type and the second conductivity type may be N type. In such case, the fifth conductivity region 112 may also include N type dopants. Accordingly, the fifth conductivity region 112 may also include a medium-voltage N type well region (e.g., MV However, in alternative non-limiting embodiments, the first conductivity type may be N type and the second conductivity type may be P type. In such case, the fifth conductivity region 111 may include P type dopants. Accordingly, the fifth conductivity region 112 may include a medium-voltage P type well region (e.g., MV PWell).

Similarly, the fifth conductivity region 112 may also further include a respective terminal region. A third terminal region 138 may be arranged at least partially within the fifth conductivity region 112. The third terminal region 138 may be configured for connection to a third external voltage. For example, a first terminal region 130 may be configured for connection to a power supply line (e.g., VDD), a second terminal region 134 may be configured for connection to an input/output line, and a third terminal region 138 may be configured for connection to ground.

The third terminal region 138 may also have the second conductivity type same as the conductivity type of the fifth conductivity region 112. The third terminal region 138 may be similar to the first and second terminal regions 130, 134. That is, the doping concentration is similar and the conductivity type is the same. The third terminal region 138 may also include a highly doped region. In some exemplary non-limiting embodiments, the first conductivity type may be P type and the second conductivity type may be N type. In such case, the third terminal region 138 may also include N type dopants. Accordingly, the third terminal region 138 may also be an N+ region like the first and second terminal regions. However, in alternative non-limiting embodiments, the first conductivity type may be N type and the second conductivity type may be P type. In such case, the third terminal region 138 may include P type dopants. Accordingly, the third terminal region 138 may also be a P+ region like the first and second terminal regions.

Referring to an exemplary non-limiting embodiment as shown in FIG. 9A, the third terminal region 138 may also be arranged immediately below a top surface of substrate 101. The third terminal region 138 may be connected to a third external terminal 164 to which the third external voltage may be applied. Further, the third terminal region 138 and the fifth conductivity region 112 may be isolated from the substrate region 102 via the first conductivity region 106 and the substrate isolation region 103 (e.g., epitaxial region 104).

The substrate 101 of the ESD protection device 900 may further include a sixth conductivity region 124 arranged within the substrate 101 and at least partially over the first conductivity region 106. At least a portion of the sixth conductivity region 124 may abut (i.e., directly contact) a portion of the first conductivity region 106. The sixth conductivity region 124 may further be arranged centrally (e.g., equidistant) between the third conductivity region 110 and the fifth conductivity region 112. The sixth conductivity region 124 may abut (i.e., directly contact) the third and fifth conductivity regions 110, 112. A first sidewall 115 of the sixth conductivity region 124 may abut the third conductivity region 110 and a second sidewall 117 (opposite the first sidewall) of the sixth conductivity region 124 may abut the fifth conductivity region 112. The sixth conductivity region 124 is separated from the second and third terminal regions 134, 138 by at least a portion of the third and fifth conductivity regions. Additionally, in some embodiments, a portion of the sixth conductivity region 124 may further overlap a portion of the third conductivity region 110 and another portion of the sixth conductivity region 124 may further overlap a portion of the fifth conductivity region 112. The overlap may provide better performance of the ESD protection device.

The sixth conductivity region 124 is similar to the fourth conductivity region 120. That is, the doping concentration is similar and the conductivity type is the same. The sixth conductivity region 124 may also be a low-voltage well region having a first conductivity type. In some exemplary non-limiting embodiments, the first conductivity type may be P type and the second conductivity type may be N type. In such case, the sixth conductivity region 124 may include P type dopants. Accordingly, the sixth conductivity region 124 may include a low-voltage P type well (e.g., LV PWell). However, in alternative non-limiting embodiments, the first conductivity type may be N type and the second conductivity type may be P type. In such case, the sixth conductivity region 124 may include N type dopants. Accordingly, the sixth conductivity region 124 may include a low-voltage N type well (e.g., LV NWell).

Referring to an exemplary non-limiting embodiment as shown in FIG. 9A, the sixth conductivity region 124 may be arranged immediately below a top surface of substrate 101. Further, the sixth conductivity region 124 may be separated from the substrate region 102 via the first conductivity region 106 and the substrate isolation region 103 (e.g., epitaxial region 104).

The sixth conductivity region 124 may further include a second highly doped floating (or unconnected) region 136. The second floating region 136 may be arranged within the sixth conductivity region 124. The second floating region 136 may be arranged at a center of the sixth conductivity region 124 so that the second floating region 136 is equidistant from the first sidewall 115 and the second sidewall 117 of the sixth conductivity region 124. The second floating region 136 is similar to the floating region 132. In some exemplary non-limiting embodiments, the first conductivity type may be P type and the second conductivity type may be N type. In such case, the first and second floating regions 132, 136 may include N type dopants. Accordingly, the first and second floating regions 132,136 may also include a N+ region. However, in alternative non-limiting embodiments, the first conductivity type may be N type and the second conductivity type may be P type. In such case, the first and second floating regions 132, 136 may include P type dopants. Accordingly, the first and second floating regions 132, 136 may include a P+ region.

Referring to an exemplary non-limiting embodiment as shown in FIG. 9A, the second floating region 136 may be arranged immediately below a top surface of substrate 101. Further, the second floating region 136 may be isolated from the substrate region 102 via the first conductivity region 106 and the substrate isolation region 103 (e.g., epitaxial region 104).

In some exemplary non-limiting embodiments, the sixth conductivity region 124 may further include a drift region 126 (e.g., P-drift for an LV PWell or N-Drift for an LV NWell) (not shown in the figures) along the boundaries (e.g., along sidewalls 115 and 117 of the sixth conductivity region 124) with the third and fifth conductivity regions 110, 112. The drift regions may help to increase the breakdown voltage of the ESD protection device 900.

The ESD protection device 900 may also include a second blocking or insulating layer 159' arranged over a top surface of the substrate 101. As shown in FIG. 9A, the second insulating layer 159' may be a second silicide blocking layer 152 arranged to extend between the third conductivity region 110 and the fifth conductivity region 112, overlapping at least a part of these conductivity regions 110, 112 and the sixth conductivity region 124. The second insulating layer 159', like the insulating layer 159, prevents silicide interaction or processing on (or in other words, block silicide, that may be deposited during fabrication of the ESD protection device 900, from interacting with) the second terminal region 134, the third terminal region 138, and the second floating region 136. The insulating layer 159' is used to electrically insulate the second floating region 136 from the terminal regions 134, 138.

The ESD protection device 900 may further include a first isolation element 140' and a second isolation element 142'. The first isolation element 140' may be configured to isolate the second conductivity region 108 and first terminal region 130. The second isolation element 142' may be configured to isolate the fifth conductivity region 112 and the third terminal region 138. The first isolation element 140' is arranged immediately below a top surface of substrate 101 on a side of the first terminal region 130 and second conductivity region 108 facing away from the floating terminal region 132 and the fourth conductivity region 120. The second isolation element 142' is arranged immediately below a top surface of substrate 101 on a side of the third terminal region 138 and fifth conductivity region 112 facing away from the second floating terminal region 136 and the sixth conductivity region 124. That is, the first and second isolation elements 140', 142' are arranged at the ends of the ESD protection device 900. For example, the first and second isolation elements 140', 142' may be shallow trench isolation (STI) blocks. Additionally, the substrate portions of ESD protection device 900 may be further isolated from other devices in the substrate by vertical isolation elements (e.g., trenches) 170', 172'.

Figure 10A:
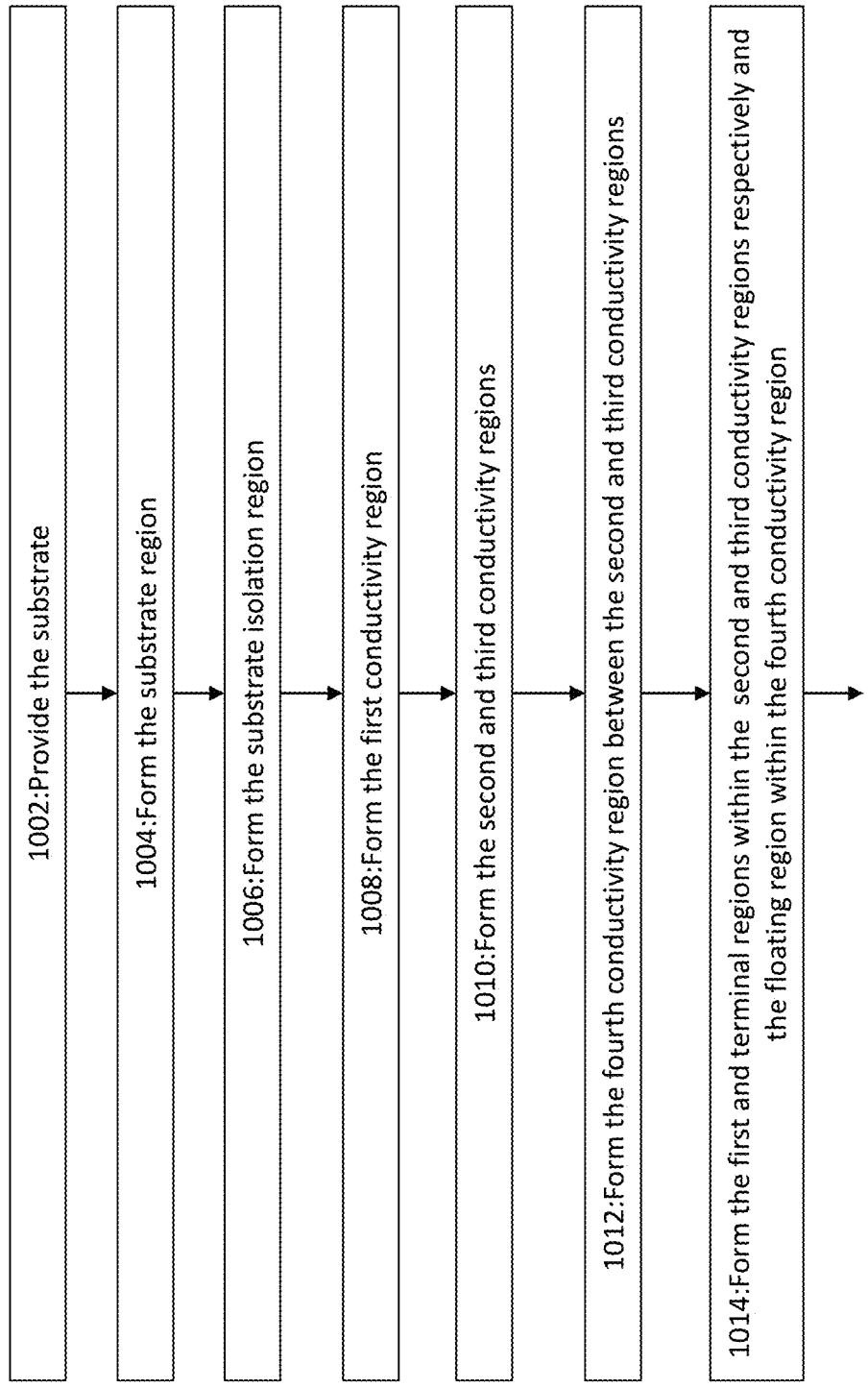
FIGS. 10A and 10B show a flow chart of a method for forming an ESD protection device according to various non-limiting embodiments.
Figure 10B:
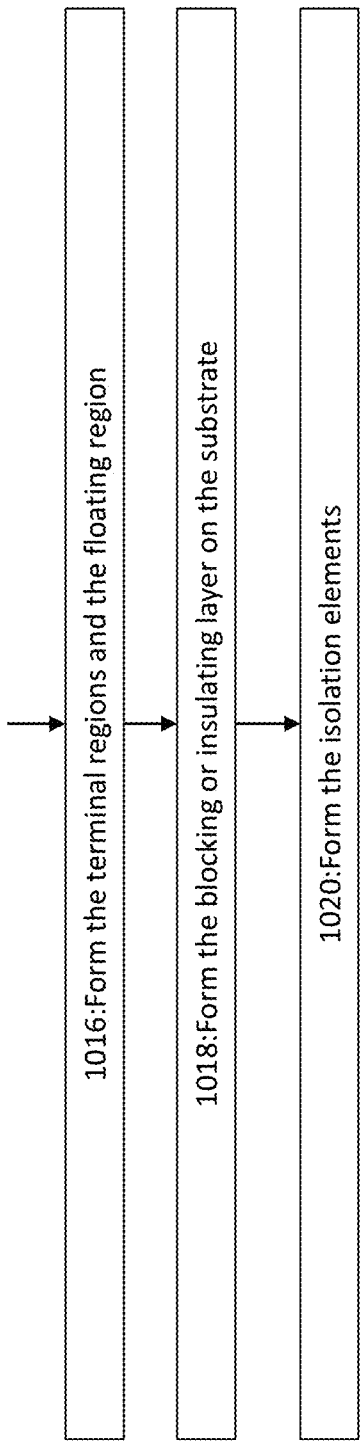

FIGS. 10A and 10B show a flow chart of a method 1000 for forming the ESD protection device according to various non-limiting embodiments. As shown in FIG. 10A, the method 1000 may begin (at 1002) by providing the substrate 101. The method 1000 may include forming (at 1004) the substrate region 102 for a first conductivity type within the substrate 101. The method 1000 may include forming (at 1006) the substrate isolation region 103 (e.g., epitaxial region 104 of a second conductivity type or a buried oxide layer 105) within the substrate 101 and at least partially over the substrate region 102. The method 1000 may include forming (at 1008) the first conductivity region 106 of the first conductivity type within substrate 101 and at least partially over the epitaxial region 104. The method 1000 may include forming (at 1010) the second and third conductivity regions 108, 110 of the second conductivity type within substrate 101 and at least partially over the first conductivity region 106. The second and third conductivity regions 108, 110 spaced apart from each other. The method 1000 may include forming (at 1012) the fourth conductivity region 120 within substrate 101 and at least partially over the first conductivity region 106 and between the second and third conductivity regions 108, 110. In some alternative non-limiting embodiments, the fourth conductivity region 120 may further be formed partially over portions of the second and third conductivity regions 108, 110.

The substrate region 102, epitaxial region 104, buried oxide region 105, first, second, third and fourth conductivity regions 106, 108, 110, 120 may be formed using any method as known to those skilled in the art. In a non-limiting example, each of these regions 102, 104, 106, 108, 110, 120 may be formed by using a mask to expose a portion of the substrate 101 intended for the respective regions 102, 104, 106, 108, 110, 120 and doping the exposed portion with the appropriate dopants (e.g. either P type or N type dopants). In a non-limiting example, the buried oxide region 105 may be formed by using a mask to expose a portion of the substrate 101 intended for the respective regions 102, 104, 106, 108, 110, 120 and implanting the exposed portion with oxygen.

Next, the method 1000 may include forming and configuring (at 1016) the terminal regions 130, 134 and the floating region 132. For example, at 1016, the method 1000 may include forming the first terminal region 130 at least partially within the second conductivity region 108, the second terminal region 134 at least partially within the third conductivity region 110, the floating region 132 at least partially within the fourth conductivity region 120, and configuring the first terminal region 130 and the second terminal region 134 for connection to the first external voltage and the second external voltage respectively. In various non-limiting embodiments, the terminal regions 130, 134 and the floating region 120 may be formed by injecting dopants into the respective portions of the substrate 101. The injection of the dopants may be performed by any method known to those skilled in the art, such as, but not limited to ion injection.

The method 1000 may further include forming (at 1018) a blocking or insulation layer 159 (e.g., silicide blocking layer 150 or polysilicon blocks 151*a*, 151*b*) over the substrate 101 to at least cover the fourth conductivity region 120 and at least partially cover the second conductivity region 108 and the third conductivity region 110. A silicide blocking layer 150 may further completely cover the floating region 132 and the fourth conductivity region 120 and at least partially cover the first terminal region 130, the second conductivity region 108, the second terminal region 134, and the third conductivity region 110. The silicide blocking layer 150 and polysilicon blocks 151*a*, 151*b* may be formed using any method as known to those skilled in the art. For instance, in a non-limiting example, the silicide blocking layer 150 may be formed by depositing a silicide blocking material over a top surface of the substrate 101, and etching the silicide blocking material.

The method 1000 may then include forming (at 1020) the isolation elements 140, 142, (e.g., shallow trench isolation (STI) blocks). In various non-limiting embodiments, the isolation elements 140, 142 may be formed by any method as known to those skilled in the art. For instance, a mask may be arranged over the substrate 101 to expose portions of the substrate 101 intended for the isolation elements 140, 142, the exposed portions may then be etched to form trenches, and the trenches may be filled with isolation material.

The method 1000 may then include forming (at 1003) the deep isolation elements 170, 172, 174 (e.g., deep trench isolation (DTI) blocks) prior to forming the substrate region. In various non-limiting embodiments, the deep isolation elements 170, 172 may be formed by any method as known to those skilled in the art. For instance, a mask may be arranged over the substrate 101 to expose portions of the substrate 101 intended for the deep isolation elements 170, 172, the exposed portions may then be etched to form deep trenches, and the trenches may be filled with isolation material.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. An electrostatic discharge (ESD) protection device comprising:
 a substrate including a bi-polar junction transistor arranged in the substrate, including:
  a first doped region, a second doped region, and a third doped region, the second doped region disposed between the first and third doped regions, wherein the second doped region is of a first conductivity type and a first doping concentration and the first and third doped regions are of a second conductivity type and a second doping concentration;
  a first doped terminal region disposed within the first doped region;
  a second doped terminal region disposed within the third doped region; and
  a doped island region disposed within the second doped region, wherein the first doped terminal region, second doped terminal region and doped island region are of the second conductivity type and a third doping concentration, the third doping concentration being higher than the first doping concentration and the second doping concentration; and
 a first conductive terminal coupled to the first doped terminal region;
 a second conductive terminal coupled to the second doped terminal region; and
 an insulation layer arranged on the substrate between the first and second conductive terminals, the insulation layer covering at least the second doped region,
 wherein the first doped region and the third doped region are spaced apart from each other,
 wherein a depth of the first doped region is substantially the same as a depth of the third doped region, and a depth of the second doped region is less than the depth of the first and third doped regions,
 wherein a first sidewall of the second doped region abuts the first doped region and a second sidewall of the second doped region abuts the third doped region, and
 wherein the second doped region overlaps at least a portion of the first doped region, and overlaps at least a portion of the third doped region.

2. The ESD protection device of claim 1, wherein the doped island region is disposed at a center of the second doped region along a top surface of the second doped region so as to be surrounded by the second doped region.

3. The ESD protection device of claim 2, wherein the second doped region is arranged symmetrically between the first doped region and the third doped region.

4. The ESD protection device of claim 3, wherein the second doped region includes a first well region and a drift region.

5. The ESD protection device of claim 4, wherein the first and third doped regions each includes a second well region.

6. The ESD protection device of claim 5, further comprising:
a fourth doped region arranged within the substrate, wherein the first, second and third doped regions are arranged over the fourth doped region, the fourth doped region is of the first conductivity type and a fourth doping concentration, the fourth doped region includes a third well region.

7. The ESD protection device of claim 6, wherein the first doping concentration is higher than the second doping concentration and the fourth doping concentration less than the third doping concentration.

8. The ESD protection device of claim 7, further comprising:
a fifth doped region arranged within the substrate, wherein the first, second, third, and fourth doped regions are arranged over the fifth doped region, the fifth doped region is of the second conductivity type and includes an epitaxial region or a buried oxide region.

9. The ESD protection device of claim 8, further comprising:
a bulk substrate region arranged within the substrate, wherein the first, second, third, fourth, and fifth doped regions are arranged over the bulk substrate region, the bulk substrate region is of the first conductivity type and is from the fourth doped region by the fifth doped region.

10. The ESD protection device of claim 9, further comprising:
a seventh doped region arranged within the substrate spaced apart from the third doped region, the seventh doped region is of the second conductivity type and the second doping concentration;
a third doped terminal region disposed within the seventh doped region, the third doped terminal region is of the second conductivity type and the third doping concentration;
a third conductive terminal coupled to the third doped terminal region;
an eighth doped region arranged within the substrate between the third and seventh doped regions, the eighth doped region is of the first conductivity type and the first doping concentration;
a second doped island region disposed within the eighth doped region, the second doped island region is of the second conductivity type and the third doping concentration; and
a second insulation layer arranged on the substrate between the second and third conductive terminals, the second insulating layer covering at least the eighth doped region.

11. The ESD protection device of claim 10, further comprising shallow trench isolation elements arranged within the substrate only at the first doped terminal region and the third doped terminal region.

12. The ESD protection device of claim 6, wherein the insulation layer is one of a silicide blocking layer or a polysilicon blocking layer.

13. The ESD protection device of claim 6, further comprising:
another bi-polar junction transistor arranged in the substrate, including another first doped region, another second doped region, and another third doped region, the another second doped region disposed between the another first and another third doped region, wherein the another second doped region is of the first conductivity type and the first doping concentration and the another first and third doped regions are of the second conductivity type and the second doping concentration;
another first doped terminal region disposed within the another first doped region;
another second doped terminal region disposed within the another third doped region;
another doped island region disposed within the another second doped region, wherein the another first doped terminal region, another second doped terminal region and another doped island region are of the second conductivity type and the third doping concentration; and
another first conductive terminal coupled to the another first doped terminal region;
another second conductive terminal coupled to the another second doped terminal region; and
another insulating layer arranged on the substrate between the another first and second conductive terminals, the another insulating layer covering at least the another second doped region,
wherein the another first doped region and the another third doped region are spaced apart from each other,
wherein a depth of the another first doped region is substantially the same as a depth of the another third doped region, and a depth of the another second doped region is less than the depth of the another first and third doped regions,
wherein a first sidewall of the another second doped region abuts the another first doped region and a second sidewall of the another second doped region abuts the another third doped region and,
wherein the another second doped region overlaps at least a portion of the another first doped region and overlaps at least a portion of the another third doped region,
wherein the second conductive terminal is connected to the another first conductive terminal.

14. The ESD protection device of claim 13, further comprising:
a deep trench isolation element arranged between the bi-polar junction transistor and the another bi-polar junction transistor, the deep trench isolation element extending from a top surface of the substrate to a bulk substrate area in the substrate.

15. The ESD protection device of claim 1, wherein the first doped terminal region has a higher doping concentration than the first doped region, the second doped terminal region has a higher doping concentration than the third doped region, and the doped island region has a higher doping concentration than the second doped region.

16. The ESD protection device of claim 15, wherein the second doped region has a higher doping concentration than the first doped region or the third doped region.

17. The ESD protection device of claim 1, wherein the insulation layer extends continuously over the second doped region and the doped island region and overlaps a portion of the first doped terminal region and the second doped terminal region.

18. A method of forming an electrostatic discharge (ESD) protection device comprising:
   providing a substrate including a bi-polar junction transistor arranged in the substrate, including:
   providing a first doped region, a second doped region, and a third doped region, the second doped region disposed between the first and third doped regions, wherein the second doped region is of a first conductivity type and a first doping concentration and the first and third doped regions are of a second conductivity type and a second doping concentration;
   providing a first doped terminal region disposed within the first doped region;
   providing a second doped terminal region disposed within the third doped region; and
   providing a doped island region disposed within the second doped region, wherein the first doped terminal region, second doped terminal region and doped island region are of the second conductivity type and a third doping concentration, the third doping concentration being higher than the first doping concentration and the second doping concentration; and
   providing a first conductive terminal coupled to the first doped terminal region;
   providing a second conductive terminal coupled to the second doped terminal region; and
   providing an insulating layer arranged on the substrate between the first and second conductive terminals, the insulating layer covering at least the second doped region,
   wherein the first doped region and the third doped region are spaced apart from each other,
   wherein a depth of the first doped region is substantially the same as a depth of the third doped region, and a depth of the second doped region is less than the depth of the first and third doped regions,
   wherein a first sidewall of the second doped region abuts the first doped region and a second sidewall of the second doped region abuts the third doped region, and
   wherein the second doped region overlaps at least a portion of the first doped region and overlaps at least a portion of the third doped region.

* * * * *